United States Patent
Miyazaki et al.

(10) Patent No.: US 7,439,183 B2
(45) Date of Patent: Oct. 21, 2008

(54) METHOD OF MANUFACTURING A SEMICONDUCTOR DEVICE, AND A SEMICONDUCTOR SUBSTRATE

(75) Inventors: Kunihiro Miyazaki, Yokohama (JP); Hiroyuki Matsuo, Suwa (JP); Toshiki Nakajima, Suwa (JP)

(73) Assignees: Kabushiki Kaisha Toshiba, Tokyo (JP); Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/211,708

(22) Filed: Aug. 26, 2005

(65) Prior Publication Data

US 2006/0046487 A1    Mar. 2, 2006

(30) Foreign Application Priority Data

Aug. 27, 2004   (JP) .............................. 2004-248957

(51) Int. Cl.
*H01L 21/302* (2006.01)
(52) U.S. Cl. .................. 438/689; 438/689; 438/706; 438/712; 257/332; 257/333; 257/336; 216/97; 216/99
(58) Field of Classification Search ............... 438/689; 257/332; 216/97
See application file for complete search history.

(56) References Cited

U.S. PATENT DOCUMENTS 4,690,729 A * 9/1987 Douglas .................... 438/695
5,868,855 A * 2/1999 Fukazawa et al. ............ 134/1.3
6,348,157 B1   2/2002 Ohmi et al.
2003/0211713 A1* 11/2003 Suguro et al. ............... 438/481
2006/0249873 A1* 11/2006 Smith et al. ................. 264/232

FOREIGN PATENT DOCUMENTS

| JP | 60-85539 | 5/1985 |
|---|---|---|
| JP | 2003-51536 | 2/2003 |
| JP | 2003-092403 | 3/2003 |
| KR | 0156115 | 12/1998 |

OTHER PUBLICATIONS

Official Action mailed by the Korean Patent Office on Oct. 16, 2006, in counterpart Korean Patent Application 10-2005-78204.
Official Action mailed by the Korean Patent Office on Oct. 16, 2006, in counterpart Korean Patent Application 10-2005-78204.
Notice of Reasons for Rejection mailed by the Japanese Patent Office on Apr. 8, 2008, for Japanese Patent Application No. 2004-248957, and English-language translation thereof.

* cited by examiner

*Primary Examiner*—Shamim Ahmed
*Assistant Examiner*—Maki Angadi
(74) *Attorney, Agent, or Firm*—Finnegan, Henderson, Farabow, Garrett & Dunner, L.L.P.

(57) ABSTRACT

A method of manufacturing a semiconductor device. In the method, a thin film is formed on an Si substrate having face orientation (100), that part of the thin film, which lies on an element-isolating region, is removed. Then, the Si substrate is subjected to selective etching, making a trench in the substrate to isolate an element, by using the thin film as mask and a mixture solution of hydrofluoric acid and ozone water.

14 Claims, 4 Drawing Sheets

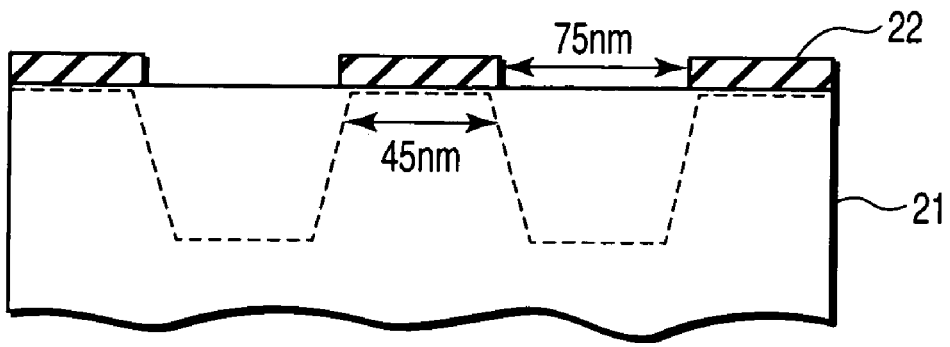
F I G. 7A
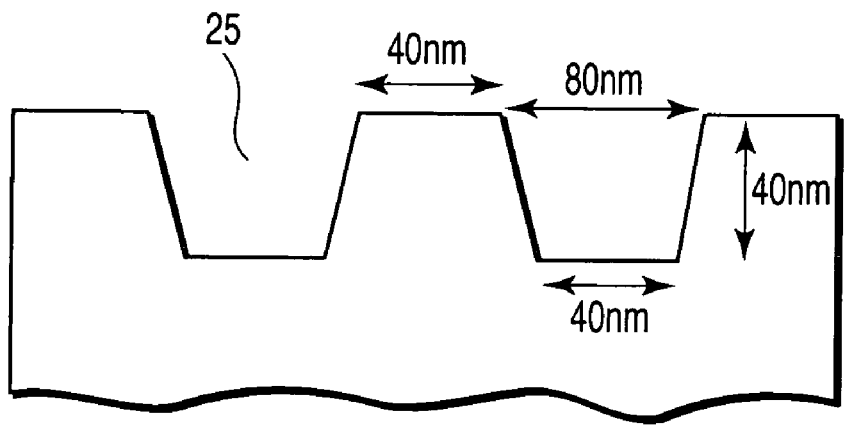
F I G. 7B
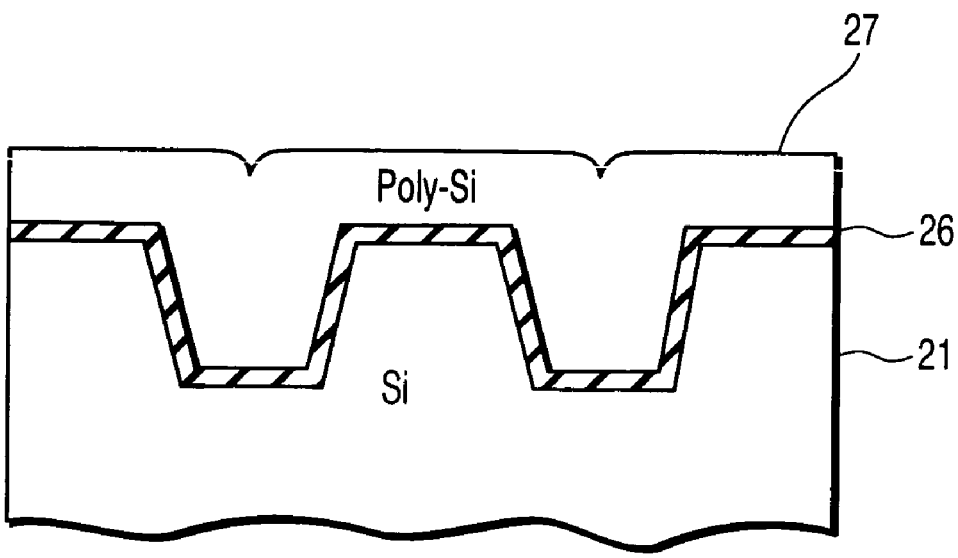
F I G. 7C

METHOD OF MANUFACTURING A SEMICONDUCTOR DEVICE, AND A SEMICONDUCTOR SUBSTRATE

CROSS-REFERENCE TO RELATED APPLICATIONS

This application is based upon and claims the benefit of priority from prior Japanese Patent Application No. 2004-248957, filed Aug. 27, 2004, the entire contents of which are incorporated herein by reference.

BACKGROUND OF THE INVENTION

1. Field of the Invention

The present invention relates to a method of manufacturing a semiconductor device. More particularly, the invention relates to a method of a semiconductor device, in which the process of forming element-isolating regions and the step of processing the substrate surface are improved. The invention also relates to a semiconductor substrate formed by performing this method.

2. Description of the Related Art

To manufacture a semiconductor device, element-isolating regions must be formed in the substrate to isolate elements from one another. To form shallow trench isolation (STI) regions, i.e., element-isolating regions isolation of one type, reaction ion etching (RIE) is carried out in most cases.

More specifically, the surface of an Si substrate is oxidized, forming a thin oxide film, a silicon nitride (SiN) film is deposited on the thin oxide film, and an oxide film (TEOS) film is deposited on the silicon nitride film. Using a resist pattern as mask, selective RIE is performed on the TEOS film. Next, using the TEOS film as mask, the nitride film is etched. Then, using the nitride film as mask, the thin oxide film and Si substrate are etched. Thereafter, the unnecessary parts of the nitride film and the unnecessary parts of the oxide film lying beneath the nitride film are removed. Then, an insulating film is deposited and buried in the STI regions formed in the substrate. (See Jpn. Pat. Appln. KOKAI Publication No. 2003-51536.)

Such a method is disadvantageous in some respects. First, many steps must be carried out to form element-isolating regions. The step of forming the TEOS film may not be performed. Even in this case, the steps that should be performed remain numerous. Second, plasma damages develop in the Si substrate when the Si substrate is subjected to dry etching such as RIE. If the damage remains in the sides of any element-isolating region, it will degrade the characteristics of transistors. In order to prevent the degradation of characteristics, a step may be performed to eliminate the damages, before the insulating film is buried in the STI regions. This increases the number of steps.

In order to increase the effective area for capacitors, trench capacitors may be formed by processing the Si substrate in the same way as in the step of forming STI regions. In this case, too, the number of manufacturing steps inevitably increases.

As described above, the conventional method is disadvantageous in two respects. First, many steps must be performed to form element-isolating regions such as STI regions or to process the surface of the Si substrate for forming trench capacitors. Second, the damages that have developed in the substrate due to RIE degrade the characteristics of elements.

BRIEF SUMMARY OF THE INVENTION

According to an aspect of the invention, there is provided a method of manufacturing a semiconductor device, comprising:

forming a thin film on a major surface of an Si substrate, the major surface having face orientation (100);

removing that part of the thin film which lies on an element-isolating region; and performing selective etching on the Si substrate by using the thin film as mask and by using a mixture solution of hydrofluoric acid and ozone water and, thereby forming an element-isolating trench in the Si substrate.

According to another aspect of the invention, there is provided a method of manufacturing a semiconductor device, comprising:

forming a thin film on a major surface of an Si substrate, the major surface having face orientation (100);

removing that part of the thin film which lies on that region of the Si substrate at which an effective major-surface area is to be increased; and performing selective etching on the Si substrate by using the thin film as mask and by using a mixture solution of hydrofluoric acid and ozone water and, thereby increasing an effective major-surface area of the Si substrate.

According to still another aspect of the invention, there is provided a semiconductor substrate comprising:

an Si substrate having a major surface of face orientation (100), a pat of which is etched in part, forming a stripe pattern and an inclined surface of face orientation (110).

BRIEF DESCRIPTION OF THE SEVERAL VIEWS OF THE DRAWING

FIGS. 7A to 7C are sectional views explaining some steps of manufacturing a semiconductor device according to a second embodiment of this invention;

DETAILED DESCRIPTION OF THE INVENTION

Embodiments of the present invention will be described, with reference to the accompanying drawings.

First Embodiment

FIGS. 1A to 1E are sectional views explaining some steps of manufacturing a semiconductor device according to a first embodiment of this invention.

Figure 1A:
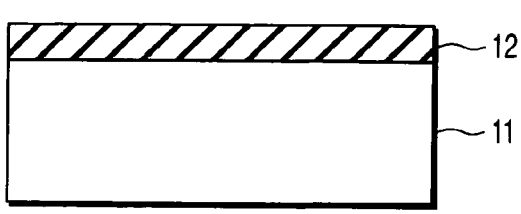
FIGS. 1A to 1E are sectional views explaining some steps of manufacturing a semiconductor device according to a first embodiment of this invention.

First, as shown in FIG. 1A, an Si substrate 11 that has the face (major surface) orientation (100) is oxidized, forming an oxide film 12 having a predetermined thickness. The thickness of the oxide film 12 is adjusted to leave residual parts after the Si substrate 11 is etched. More precisely, the thickness is adjusted in accordance with the depth of an STI region to be formed in the Si substrate 11, the rate at which the oxide film is to be etched and the rate at which the Si substrate is to be etched.

Figure 1B:
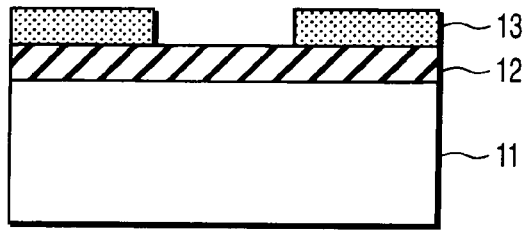

As FIG. 1B shows, a resist pattern 13 is formed on the oxide film 12. The resist pattern 13 has an opening, which exposes that part of the film 12, below which an STI should be formed in the Si substrate 11. More specifically, a resist film is formed on the oxide film 12, exposed to light in accordance with the pattern of the element-isolating region, and subjected to a developing process. As a result, the resist pattern 13 is formed.

Figure 1C:
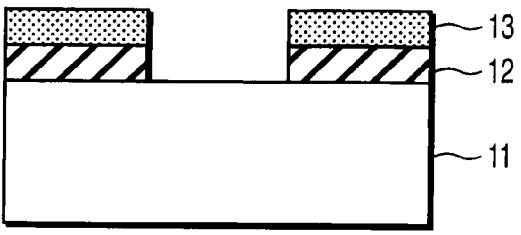

As FIG. 1C shows, selective etching is performed on the oxide film 12, by using the resist pattern 13 as mask. The selective etching may be dry etching, such as RIE, or wet etching. If it is isotropic etching, the opening of the resist pattern 13 must be of such a size that the element-isolating region has a desired width.

Figure 1D:
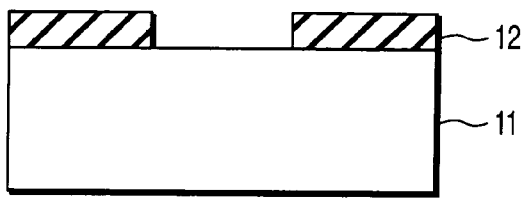

As shown in FIG. 1D, the resist pattern 13 is removed after the pattern 13 has been used to process the oxide film 12. The method of removing the resist pattern 13 may be ashing process or ordinary process using a mixture of sulfuric acid and hydrogen peroxide solution, or a combination thereof.

Figure 1E:
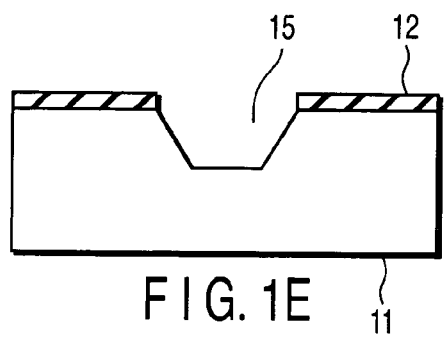

As FIG. 1E shows, etching is performed on the Si substrate 11 by using the oxide film 12 as mask and applying a mixture solution of hydrofluoric acid at concentration of 0.05 to 2% and ozone water at concentration of 3 to 20 ppm. This etching results in an STI region 15. The oxide film 12, which has been used as mask to etch the Si substrate 11, is removed by applying hydrofluoric acid. Thus, the process of forming the STI region is completed.

Another process is later carried out, burying an oxide film or the like in the STI region 15. This oxide film is used as element-isolating insulating film. Note that "%" defining the hydrofluoric acid concentration in the mixture solution is percent by weight (wt %).

Figure 2:
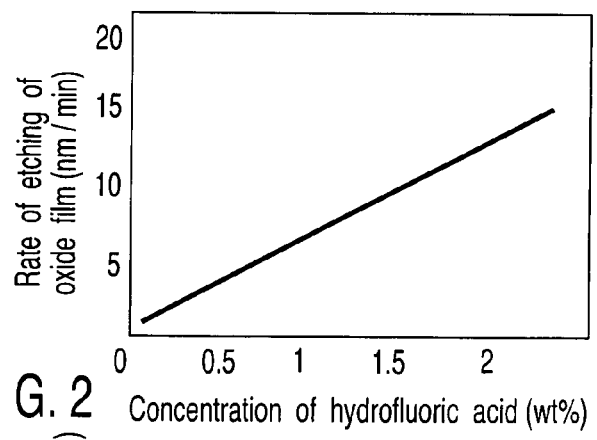
FIG. 2 is a graph representing the relation between the concentration of hydrofluoric acid and the etching rate of oxide film.
Figure 3:
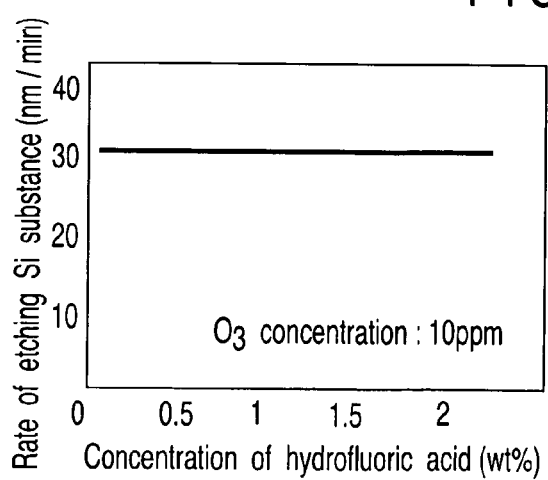
FIG. 3 is a graph illustrating the relation between the concentration of hydrofluoric acid and the etching rate of an Si substrate.
Figure 4:
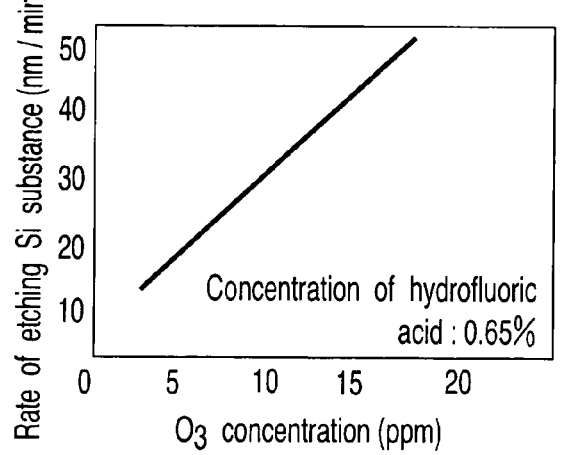
FIG. 4 is a graph showing the relation between ozone-water concentration and the etching rate of the Si substrate.

FIGS. 2 to 4 show the rates at which a thermally oxidized film and the Si substrate are etched with the mixture solution of hydrofluoric acid and ozone water.

As FIG. 2 shows, the higher the concentration of hydrofluoric acid, the higher the etching rate of the thermally oxidized film. Thus, the etching rate of the thermally oxidized film depends on the concentration of the hydrofluoric acid. By contrast, the etching rate of the Si substrate does not change as the concentration of hydrofluoric acid changes, as is seen from FIG. 3. That is, the etching rate of the Si substrate does not depend on the concentration of hydrofluoric acid. As FIG. 4 shows, the etching rate of the Si substrate increases with the concentration of ozone water when the substrate is etched with the mixture solution of hydrofluoric acid and ozone water. In other words, the etching rate of the Si substrate depends on the concentration of ozone water.

Hence, the etching rates of the thermally oxidized film and Si substrate can be set at desired values by selecting appropriate values for the hydrofluoric acid concentration and the ozone water concentration.

A mixture solution of hydrofluoric acid at concentration of 0.65% and ozone water at concentration 10 ppm, for example, may be used as etchant. In this case, the thermally oxidized film used as mask is etched at about 4 nm/min, and the Si substrate is etched at 33 nm/min. Since the etching performed on the Si substrate is anisotropic, it would scarcely proceed in the horizontal direction. Therefore, the Si substrate will have a trapezoidal cross section. The substrate is etched in the horizontal direction for a distance almost the same as the distance for which the thermally oxidized film is etched in the horizontal direction.

In practice, the concentration of hydrofluoric acid ranges from 0.05% to 2%, and the concentration of ozone water ranges from 3 ppm to 20 ppm. The etching rate of the thermally oxidized film is about 0.5 to 13 nm/min, and that of the Si substrate is about 15 to 100 nm/min. Thus, the concentrations of the hydrofluoric acid and ozone water are set at 0.05% and 20 ppm, respectively, in order to increase the difference in etching rate between the oxide film and the Si substrate. Conversely, to reduce this difference, the concentrations of the hydrofluoric acid and ozone water are set at 2% and 3 ppm, respectively.

The etching using the mixture solution of hydrofluoric acid and ozone water may be carried out in batch process or one-by-one process. In the batch process, semiconductor substrates are immersed in the mixed solution. In the one-by-one process, the mixed solution is applied from a nozzle to substrates, one after another. So long as the concentrations of the hydrofluoric acid and ozone water fall within the ranges specified above, the etching may be performed in a sequence of continuously generating ozone and discarding the solution used, or in a recycling system of dissolving ozone into hydrofluoric acid solution being circulated. After washing down the mixed solution of hydrofluoric acid and ozone water, the semiconductor substrate is washed with water and dried by a drying machine. Then, the oxide film used as mask is removed from the semiconductor substrate, which is subjected to the next manufacturing step.

Assume that the mask is so thin that it can be fully removed during the etching using the mixture solution of hydrofluoric acid and ozone water. Then, the step of removing the oxide film can be omitted. To form an STI region by etching the Si substrate to a depth of, for example, 300 nm, an oxide film having thickness of 20 nm is formed to be used as mask and treated with a solution of hydrofluoric acid at concentration of 0.3% and ozone water at concentration of 15 ppm, for eight (8) minutes. The mask is thereby removed completely at the end of the etching. The resultant STI region can have a depth of 300 nm as is desired.

As pointed out above, the etching may be carried out in batch process of immersing semiconductor substrates in the mixed solution, or in one-by-one process of applying the mixed solution from a nozzle to semiconductor substrates, one after another. The batch process is preferable if the process time is rather long, because the batch process is more efficient. After the semiconductor substrate is treated with the mixture solution, it is washed with water, removing the solution from it. Thereafter, the semiconductor substrate is dried and subjected to the next manufacturing step.

In this embodiment, a mixture solution of hydrofluoric acid and ozone water is used, etching the Si substrate by using the oxide film as mask. It is therefore unnecessary to form a nitride film, to perform patterning on the nitride film or to remove the patterned nitride film as is required in the conventional method. The embodiment can, therefore, shorten the time of manufacturing semiconductor devices. The ratio of the etching rates of Si substrate to that of the thermally oxidized film can be increased to a sufficient value only if the hydrofluoric acid concentration and the ozone concentration are set to optimal values. Further, the embodiment can enhance the reliability of elements, because plasma damages do not develop in the Si substrate, which may result if RIE is carried out.

This embodiment can reduce the surface roughness of the Si substrate. This is because the embodiment applies a mixture solution of hydrofluoric acid and ozone water to the Si substrate, thereby etching the surface of the Si substrate.

Figure 5:
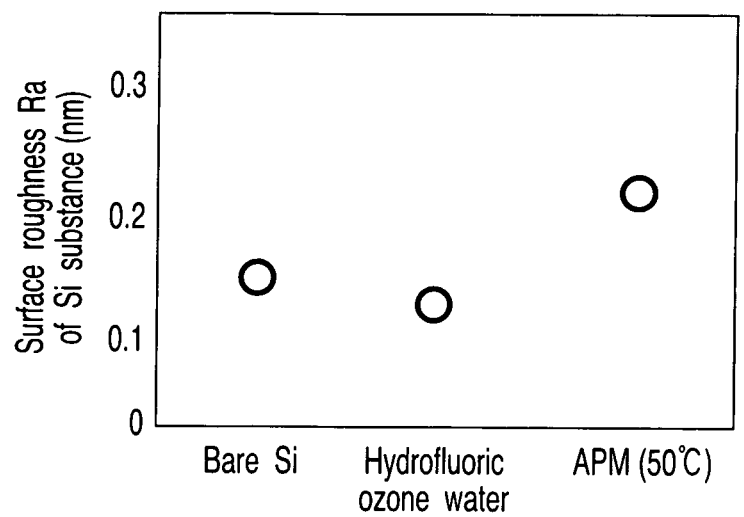
FIG. 5 is a graph showing various values of surface roughness that the Si substrate may have.

FIG. 5 is a graph showing various values of surface roughness that have been measured of Si substrates. A bare Si substrate not etched with a mixture solution of hydrofluoric acid and ozone water had surface roughness Ra of 0.18. After etched with the mixture solution, the Si substrate exhibited surface roughness Ra of 0.14; its surface roughness decreased. When a bare Si substrate was etched with a mixture solution (APM) of ammonia and hydrogen peroxide solution, its surface roughness Ra changed to 2 or more; its surface roughness increased.

The etching performed on the Si substrate by using the mixture solution of hydrofluoric acid and ozone water becomes anisotropic. This is a specific phenomenon observed if the Si substrate has the face (major surface) orientation (100). The etching will not be anisotropic if the Si substrate has the face orientation (111) or the face orientation (110).

Figure 6A:
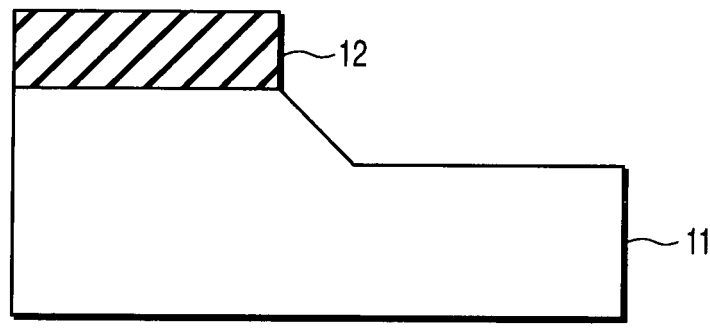
FIGS. 6A to 6C are diagrams showing sectional TEM images observed in different crystal orientations.
Figure 6B:
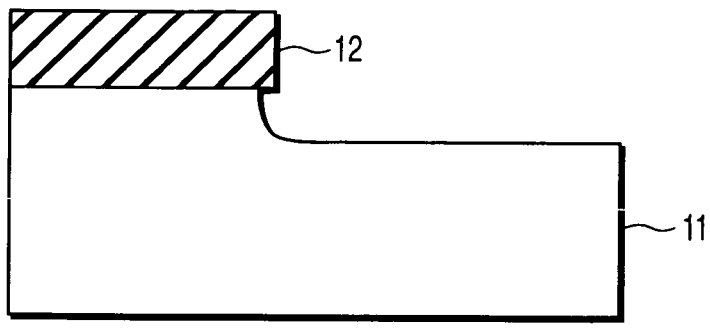
Figure 6C:
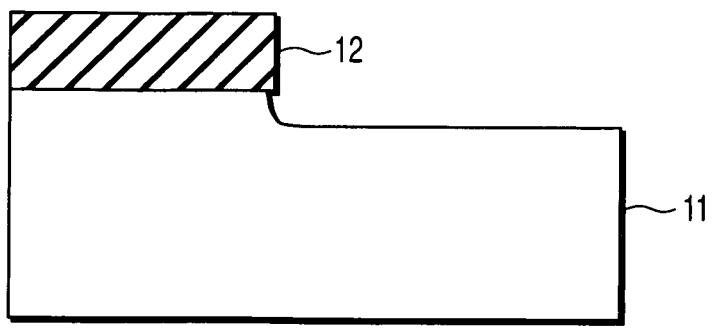

FIGS. 6A to 6C are diagrams showing sectional TEM images observed in different crystal orientations in the case where Si substrates are etched with a mixture solution of hydrofluoric acid and ozone water.

Si substrates were subjected to selective etching that used an oxide film as mask. Of these substrates, an Si substrate having the face orientation (100) underwent anisotropic etching, not isotropic etching. As a result, the (110) face of the substrate was exposed as is illustrated in FIG. 6A.

By contrast, an Si substrate having face orientation of (110) underwent isotropic etching as shown in FIG. 6B. The etching rate was small, and side etching took place. An Si substrate having face orientation of (111) underwent isotropic etching, too, as shown in FIG. 6C. The etching rate was smaller than in the case depicted in FIG. 6B, and side etching occurred.

The present embodiment is characterized not only in that a mixture solution of hydrofluoric acid and ozone water is used, but also in that the Si substrate is one that has the face orientation (100). The number of steps that should be carried out to form an element-isolating region is smaller than otherwise. In addition, the element-isolating region formed has a desirable shape, having no side-etched parts. This embodiment can therefore reduce the manufacturing cost of semiconductor devices and can enhance the reliability of elements thereof.

Second Embodiment

FIGS. 7A to 7C are sectional views explaining some steps of manufacturing a semiconductor device according to a second embodiment of this invention. More precisely, they explain a method of manufacturing a capacitor that has a three-dimensional structure.

First, as shown in FIG. 7A, the surface of an Si substrate having the face orientation (100) is oxidized, forming an oxide film 22 that is 2.5 nm thick. Then, as in the first embodiment, the oxide film 22 is subjected to selective etching, in which a resist pattern (not shown) is used. A line-and-space pattern is thereby formed. This pattern consists of lines (i.e., openings) and spaces (i.e., strips of oxide film). The lines have a width of 75 nm, and the spaces have a width of 45 nm.

Next, as FIG. 7B shows, a mixture solution of hydrofluoric and ozone water is applied, using the oxide film 22 as mask, thus performing selective etching on the Si substrate 21. Trenches 25 having a depth of 40 nm are thereby made in the Si substrate 21. The trenches 25 are 40 nm wide at the bottom and 80 nm wide at the top. The concentration of hydrofluoric acid and the concentration of the ozone water are set to such appropriate values as in the first embodiment. The oxide film 22 is thereby removed completely at the end of the etching.

As FIG. 7C shows, an insulating film 26 is formed on the surface of the Si substrate 21 to provide a capacitor. Subsequently, a polysilicon film 27 is deposited, which fills the trenches 25.

To make trenches in the surface of the Si substrate 22, a mixture solution of hydrofluoric acid and ozone water is applied to the surface of the Si substrate 21 as in the first embodiment. Thereafter, an impurity-diffused region and an insulating film are formed and polysilicon layers (electrodes) are deposited, thereby increasing the effective area of the capacitor. The subsequent manufacturing steps are carried out, which are identical to the conventional ones for manufacturing semiconductor devices. Since its surface is treated with a mixture solution of hydrofluoric acid and ozone water, the Si substrate 21 has no damages. It is therefore unnecessary to perform any step to eliminate damages. The number of steps that should be carried out to form the capacitor is smaller than otherwise. Further, it is easy to increase the effective area of the capacitor.

The oxide film 22 used as mask may have thickness of 2.5 nm. In this case, the mask can be completely removed if it is treated for one minute with a mixture solution of hydrofluoric acid at concentration of 0.3% and ozone water at concentration of 15 ppm. Thus, a stepped part having height of 40 nm can be formed. A semiconductor element such as a capacitor may be formed at the stepped part. This helps to increase the effective area 1.5 times or more.

The etching may be carried out in batch process or one-by-one process. In the back process, semiconductor substrates are immersed in the mixed solution. In the one-by-one process, the mixed solution is applied from a nozzle to substrates, one after another. After the semiconductor substrate is treated with the mixture solution of hydrofluoric acid and ozone water, it is washed with water, removing the solution from it. Thereafter, the semiconductor substrate is dried and subjected to the next manufacturing step.

In this embodiment, the Si substrate 21 having the face orientation (100) is etched with a mixture solution of hydrofluoric acid and ozone water in order to provide a trench capacitor. Therefore, trenches can be made in the surface of the substrate 21 without damaging the substrate 12, and the effective surface area of the substrate 21 can be thereby increased. Thus, the surface of the Si substrate is processed to form a trench capacitor, in fewer steps than otherwise, and no damages develop in the substrate while the substrate is being processed. This embodiment can therefore reduce the manufacturing cost of semiconductor devices and enhance the reliability of elements thereof.

Third Embodiment

Figure 8:
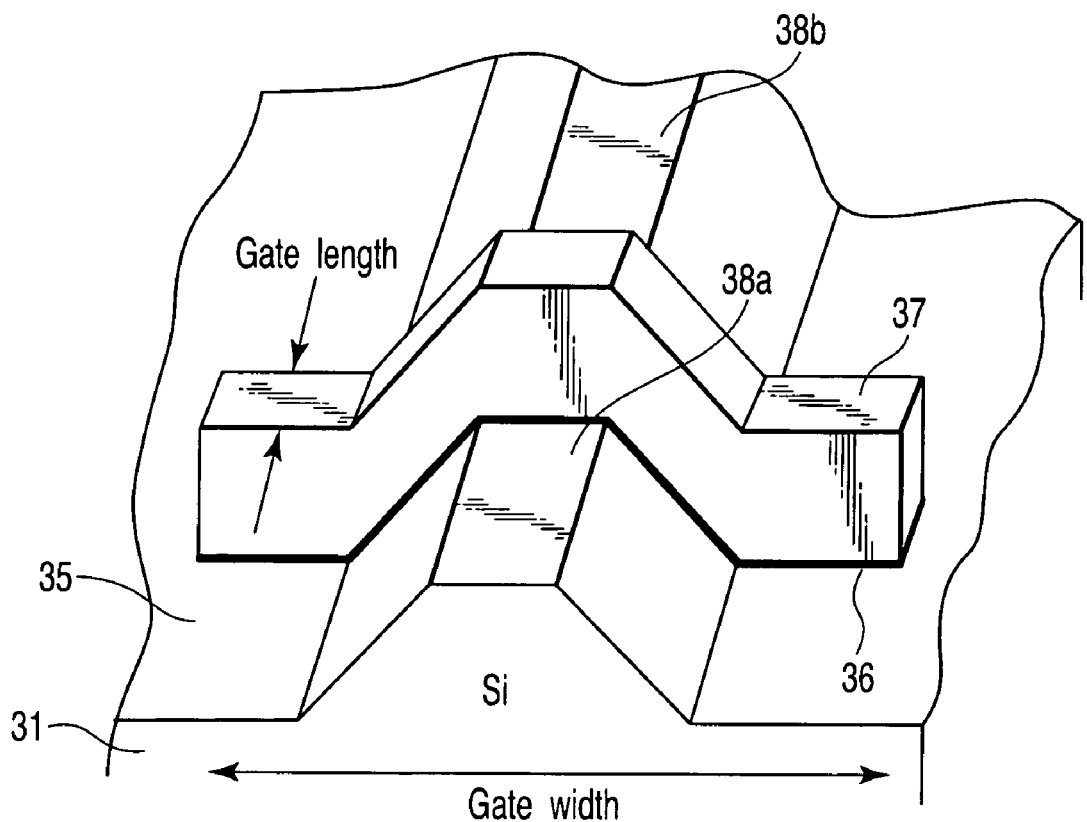
FIG. 8 is a perspective view outlining a semiconductor device according to a third embodiment of this invention.
Figure 9:
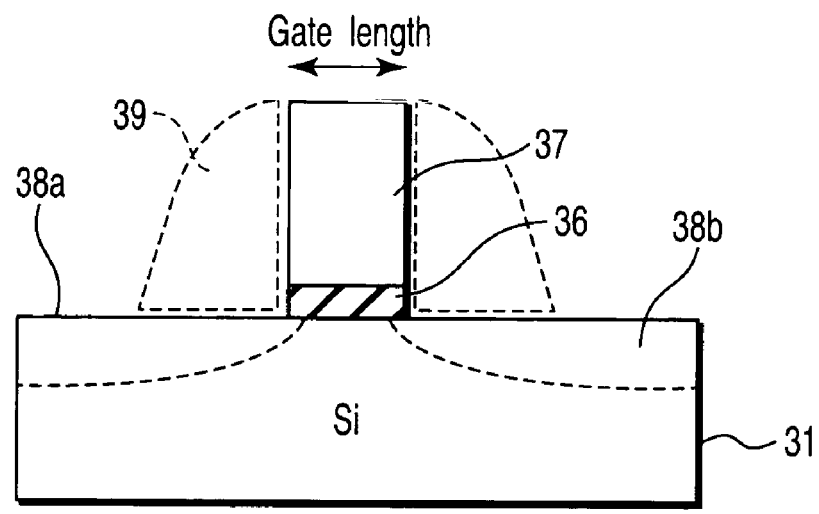
FIG. 9 is a sectional view outlining the semiconductor device according to the third embodiment of this invention.

FIGS. 8 and 9 schematically illustrate a semiconductor device according to a third embodiment of this invention. FIG. 8 is a perspective view, and FIG. 9 is a sectional view taken along a ling extending in the lengthwise direction of gate.

This embodiment is concerned with a MOSFET to be sued as a power element such as IGBT. The embodiment is characterized by an increase in the effective element area.

A channel 35 having (110)-face sides is cut in the surface of an Si substrate 31 that has the face orientation (100). The channel 35 can be made in the same way as sown in FIGS. 7A and 7B. A gate insulating film 36 is provided on the surface of the substrate 31. A gate electrode 37 is formed on the gate insulating film 36. A source-drain region 38 is provided in the surface of the substrate 31. More precisely, a source region 38a and a drain region 38b are formed in the substrate 31, spaced from each other by a region that lies beneath the gate electrode 37. Side insulating films 39 are formed on the sides of the gate electrode 37, as is illustrated in FIG. 9. The side insulating films 39 are not shown in FIG. 8, for showing the element structure clearly.

This structure is advantageous in that the gate electrode 37 has a large effective width, though it does not appear so long and so broad as viewed from above. Hence, a larger current can flow between the source and drain than in the conventional MOSFET. It is desired that the gate insulating film 36 be made of material that has high permittivity. The gate electrode 37 may not necessarily be made of polysilicon. It can be a metal gate.

In this embodiment, too, a trench can be made in the surface of the substrate 31 without damaging the substrate 31, by etching the substrate 31 having the face orientation (100) with a mixture solution of hydrofluoric acid and ozone water. The effective surface area of the substrate can therefore be increased. As in the second embodiment, the Si substrate can be processed in a small number of steps, and no damages develop in the substrate during the processing of the substrate. This decreases the manufacturing cost of the MOSFET and enhances the reliability thereof. A contact hole may be made in the same way. Then, the effective contact-surface area can be increased to reduce the contact resistance.

(Modification)

The present invention is not limited to the embodiments that have been described above. In each embodiment described above, the Si substrate is one that has the face orientation (100). Instead, a silicon-on-insulator (SOI) substrate can be used in the present invention. An SOI substrate may be etched with a mixture solution of hydrofluoric acid and ozone water, until the oxide base layer is exposed. Then, element isolation can be easily accomplished. Since the oxide has a much lower etching rate than silicon, the oxide base layer can serve as etching stopper, which increases the process margin. Hence, a semiconductor element of even higher performance can be manufactured.

Moreover, the thin film formed on the Si substrate is not limited to an oxide film. A film of any other material that has an etching rate lower than that of the Si substrate can be used instead. Further, the concentrations of hydrofluoric acid and ozone water, i.e., components of the mixture solution, may be changed as needed, in accordance with the ratio between the etching rate of the thin film (used as mask) and that of the Si substrate. Furthermore, the mixture solution of hydrofluoric acid and ozone water may be replaced by a solution of hydrofluoric acid, which can remove the oxide film used as mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   forming a thin film on a major surface of a Si substrate, the major surface having face orientation (100);
   removing a part of the thin film which lies on an element-isolating region; and
   selectively etching the Si substrate by using the thin film as a mask and applying a mixture solution containing hydrofluoric acid and ozone water to the Si substrate,
   wherein the Si substrate undergoes selective anisotropic etching until a (110) face is exposed at sides of the Si substrate, thereby forming an element-isolating trench in the Si substrate having no side-etched parts.

2. The method according to claim 1, wherein the thin film is an oxide film formed by thermally oxidizing the Si substrate.

3. The method according to claim 2, wherein the oxide film is etched at a rate lower than the Si substrate when the Si substrate is etched, and has such a thickness as to be etched away when etching of the Si substrate is completed.

4. The method according to claim 1, wherein hydrofluoric acid and ozone water have concentration of 0.05 to 2 wt % and concentration of 3 to 20 ppm, respectively, in the mixture solution.

5. The method according to claim 1, wherein a resist pattern is formed on the thin film in order to remove that part of the thin film which lies on an element-isolating region, selective etching is performed on the thin film by using the resist pattern as mask, and the resist pattern is removed after the selective etching is performed.

6. A method of manufacturing a semiconductor device, comprising:
   forming a thin film on a major surface of a Si substrate, the major surface having face orientation (100);
   removing a part of the thin film which lies on that region of the Si substrate at which an effective major-surface area is to be increased; and
   selectively etching the Si substrate by using the thin film as a mask and applying a mixture solution containing hydrofluoric acid and ozone water to the Si substrate,
   wherein the Si substrate undergoes selective anisotropic etching until a (110) face is exposed at sides of the Si substrate, thereby increasing an effective major-surface area of the Si substrate.

7. The method according to claim 6, wherein the thin film is an oxide film formed by thermally oxidizing the Si substrate.

8. The method according to claim 7, wherein the oxide film is etched at a rate lower than the Si substrate when the Si substrate is etched, and has such a thickness as to be etched away when etching of the Si substrate is completed.

9. The method according to claim 6, wherein hydrofluoric acid and ozone water have concentration of 0.05 to 2 wt % and concentration of 3 to 20 ppm, respectively, in the mixture solution.

10. The method according to claim 6, wherein a resist pattern is formed on the thin film in order to remove that part of the thin film which lies on that part of the Si substrate at which the effective major-surface area is to be increased, selective etching is performed on the thin film by using the resist pattern as mask, and the resist pattern is removed after the selective etching is performed.

11. The method according to claim 6, wherein the thin film is removed in part, thereby forming a line-opening pattern.

12. The method according to claim 6, wherein the thin film is removed in part, thereby forming a line-and-space pattern.

13. The method according to claim 6, further comprising: forming a capacitor-insulating film on the major surface of the substrate that has the effective major-surface area increased; and forming a capacitor electrode on the capacitor-insulating film.

14. The method according to claim 6, further comprising: forming a gate-insulating film on the major surface of the substrate that has the effective major-surface area increased; and forming a gate electrode on the gate-insulating film.

* * * * *